United States Patent [19]
Si et al.

[11] Patent Number: 5,629,229
[45] Date of Patent: May 13, 1997

[54] METALORGANIC CHEMICAL VAPOR DEPOSITION OF $(Ba_{1-x}Sr_x)RuO_3/(Ba_{1-x}Sr_x)TiO_3/(Ba_{1-x}Sr_x)TiO_3/(Ba_{1-x}Sr_x)RuO_3$ CAPACITORS FOR HIGH DIELECTRIC MATERIALS

[75] Inventors: Jie Si; Seshu B. Desu; Chien-Hsiung Peng, all of Blacksburg, Va.

[73] Assignees: Sharp Kabushiki Kaisha, Osaka, Japan; Virginia Tech Intellectual Properties, Inc., Blacksburg, Va.

[21] Appl. No.: 501,352

[22] Filed: Jul. 12, 1995

[51] Int. Cl.$^6$ .................................................. H01L 21/70
[52] U.S. Cl. .......................... 438/3; 438/396; 438/240
[58] Field of Search .......................... 437/60, 225, 235, 437/919, 965; 148/DIG. 14

[56] References Cited

U.S. PATENT DOCUMENTS

| | | | |
|---|---|---|---|
| 5,335,138 | 8/1994 | Sandhu et al. | 437/60 |
| 5,393,352 | 2/1995 | Summerfelt | 437/235 |
| 5,478,772 | 12/1995 | Fazan | 437/919 |
| 5,491,102 | 2/1996 | Desu et al. | 437/919 |
| 5,504,041 | 4/1996 | Summerfelt | 437/60 |

*Primary Examiner*—Trung Dang
*Attorney, Agent, or Firm*—Davis, Graham & Stubbs

[57] ABSTRACT

A dynamic random access memory device having a ferroelectric thin film perovskite $(Ba_{1-x}Sr_x)TiO_3$ layer sandwiched by top and bottom $(Ba_{1-x}Sr_x)RuO_3$ electrodes. The memory device is made by a MOCVD process including the steps of providing a semiconductor substrate, heating the substrate, exposing the substrate to precursors including at least $Ru(C_5H_5)_2$, thereafter exposing the substrate to precursors including at least $TiO(C_2H_5)_4$ and thereafter exposing the substrate to precursors including at least $Ru(C_5H_5)_2$.

8 Claims, 3 Drawing Sheets

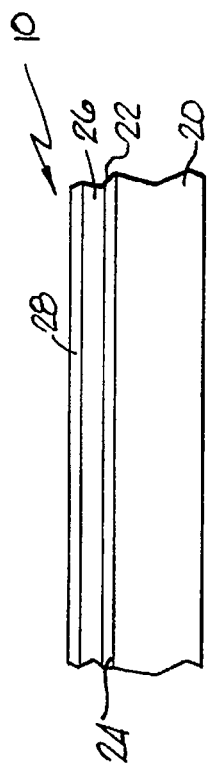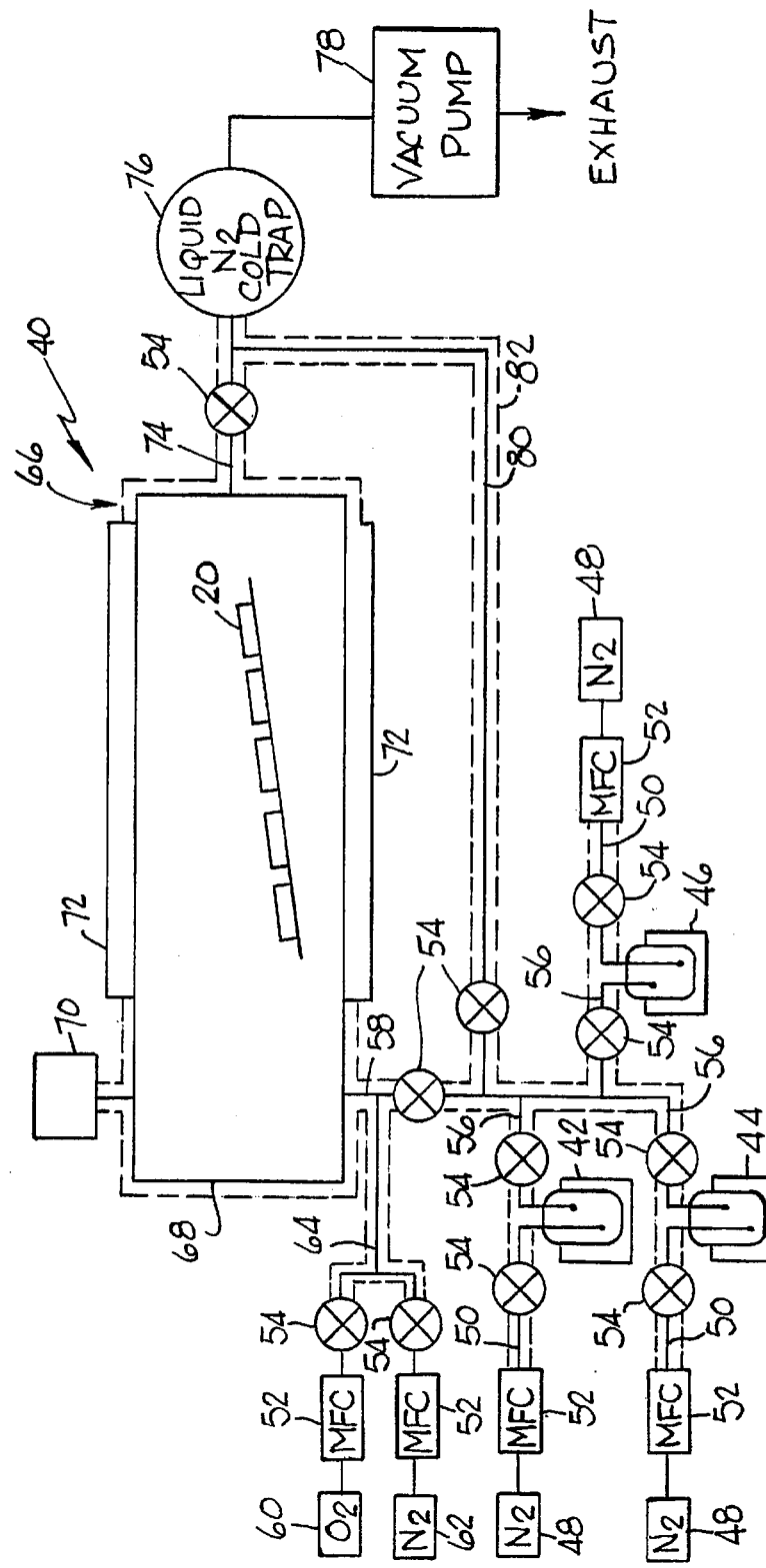

METALORGANIC CHEMICAL VAPOR DEPOSITION OF $(Ba_{1-x}Sr_x)RuO_3/(Ba_{1-x}Sr_x)TiO_3/(Ba_{1-x}Sr_x)TiO_3/(Ba_{1-x}Sr_x)RuO_3$ CAPACITORS FOR HIGH DIELECTRIC MATERIALS

FIELD OF INVENTION

The present invention relates to dynamic random access memory devices ("DRAMs"), and more particularly to high capacitance capacitors for DRAMs and a method of making high capacitance capacitors for DRAMs.

BACKGROUND OF THE INVENTION

Semiconductor devices such as DRAMs have decreased in size and increased in charge storage density dramatically over the last 20 years. As the capacity of DRAM cells has increased and their size has decreased, the design of the cells has become increasingly complex in order to achieve sufficient electrical capacitance to hold the electrical charge representing the stored data.

Traditionally, silicon dioxide has been used as the dielectric in the capacitors of DRAM cells. Silicon dioxide, however, has a relatively low dielectric constant and thus, limited charge storage density. This has resulted in experimentation with the use of materials with higher dielectric constant to increase the electrical capacitance in these very small complex cells.

In recent years ferroelectric materials such as barium strontium titanate $(Ba_{1-x}Sr_xTiO_3)$ have been examined for use in dynamic random access memory devices. $Ba_{1-x}Sr_xTiO_3$ films are desirable in that they have relatively high dielectric constants ($\epsilon_r$), ranging from 300 to 800 depending on the value of "x". $Ba_{1-x}Sr_xTiO_3$ films are easy to prepare and are structurally stable. Because of their high dielectric constants, $Ba_{1-x}Sr_xTiO_3$ films provide almost an order of magnitude higher capacitance density in DRAM cell capacitors than conventional dielectrics such as silicon dioxide. Further, $Ba_{1-x}Sr_xTiO_3$ has a low Curie point temperature, ranging between 105° K. to 430° K. depending on the value of "x". This results in a small temperature coefficient of capacitance. Additionally, $Ba_{1-x}Sr_xTiO_3$ is not affected by piezoelectric effect because it exhibits a paraelectric phase at room temperature. This opens up the possibility of integrating a $Ba_{1-x}Sr_xTiO_3$ capacitor into the existing silicon and gallium arsenide ultra large scale integrated circuit (ULSI) technology to make a commercial dynamic random access memory device.

Several problems still need to be overcome, however, before a commercially viable memory product is available. Foremost among these problems is the degradation of ferroelectric devices due to fatigue, low voltage breakdown and aging. Degradation causes dielectric breakdown of the ferroelectric device and as such results in a decrease in the dielectric constant, thereby decreasing the charge density storage capacity. A common cause of degradation is the interaction between defects in the materials and the ferroelectric-electrode interface/grain boundaries in the ferroelectric capacitor. For example, fatigue degradation, which is one of the prime obstacles to forming high quality ferroelectric films, is caused by defect entrapment in the ferroelectric-electrode interface.

Defect entrapment at the ferroelectric-electrode interface is caused by asymmetric ferroelectric-electrode interfaces and by non-uniform domain distribution in the bulk. Asymmetric electrode-ferroelectric interfaces and/or non-uniform domain distribution in the bulk lead to asymmetric polarization on alternating polarity. This results in an internal field difference which can cause effective one-directional movement of defects such as vacancies and mobile impurity ions. Because the electrode-ferroelectric interface is chemically unstable, it provides sites of lower potential energy relative to the bulk ferroelectric, thereby causing defect entrapment at the interface (see Yoo, et al., "Fatigue Modeling of Lead Zirconate Titanate Thin Films", Jour. Material Sci. and Engineering), resulting in a loss of dielectric constant in the ferroelectric.

To overcome the problems associated with defects it is necessary to control the defect concentration, defect migration to the interface, and defect entrapment at the interface. Defect migration and entrapment can be controlled by reducing the abrupt compositional gradient between the electrode and the ferroelectric. It is also necessary to control the state of the interface itself because lattice mismatch, poor adhesion, and large work function differences between the electrode and the ferroelectric cause the interface to be chemically unstable.

The present invention is intended to overcome one or more of the problems discussed above.

SUMMARY OF THE INVENTION

The present invention is a dynamic random access memory device having a ferroelectric thin film perovskite layer sandwiched by top and bottom conducting oxide electrodes. The device in a preferred embodiment includes a substrate of silicon, gallium arsenide or other known substrate materials, a bottom electrode which is a thin film of $(Ba_{1-x}Sr_x)RuO_3$, a ferroelectric thin film of $(Ba_{1-x}Sr_x)TiO_3$ and a top electrode which is a thin film of $(Ba_{1-x}Sr_x)RuO_3$.

The $(Ba_{1-x}Sr_x)TiO_3$ ferroelectric of the present invention has very desirable properties for use in dynamic random access ferroelectric memory devices, including ease of preparation, structural stability, a low Curie temperature at which the transition occurs from the ferroelectric to the paraelectric state, a high saturation polarization, high dielectric constant, and relatively low piezoelectric coefficients. Additionally, $(Ba_{1-x}Sr_x)TiO_3$ and $(Ba_{1-x}Sr_x)RuO_3$ have a very similar crystal lattice structure which increases the stability of the ferroelectric-electrode interface and decreases the degradation of the ferroelectric device due to fatigue, low voltage breakdown and aging.

The $(Ba_{1-x}Sr_x)TiO_3$ ferroelectric layer and the $(Ba_{1-x}Sr_x)RuO_3$ conducting oxide electrode layers are applied to the substrate by utilizing either a three step metalorganic chemical vapor deposition process or by a liquid source delivery method. The three step metalorganic chemical vapor deposition (MOCVD) process for depositing the $(Ba_{1-x}Sr_x)TiO_3$ ferroelectric uses precursors of $Ba(thd)_2$ and $Sr(thd)_2$, where $thd=C_{11}H_{19}O_2$, and $Ti(OC_2H_5)_4$ with $N_2$ as a carrier gas and $O_2$ as a dilute gas. The MOCVD process for depositing the $(Ba_{1-x}Sr_x)RuO_3$ conducting electrodes uses precursors of $Ba(thd)_2$ and $Sr(thd)_2$, where $thd=C_{11}H_{19}O_2$, and $Ru(C_5H_5)_2$ with $N_2$ as a carrier gas and $O_2$ as a dilute gas. The MOCVD process produces thin films with excellent film uniformly, composition control, high density, high deposition rates and excellent step coverage, utilizing fairly simple equipment that is amenable to large scale processing.

The newer liquid source delivery method may also be used in applying the $(Ba_{1-x}Sr_x)TiO_3$ ferroelectric layer and the $(Ba_{1-x}Sr_x)RuO_3$ conducting oxide electrode layers to the substrate, this method having some advantages over the MOCVD process previously described. MOCVD precursor vapor delivery systems require the control of the temperature and flow rate for each precursor. Some metalorganic precusors, such as Sr and Ba, used in MOCVD of ferroelectrics are not stable at the requisite sublimation temperatures, making accurate control of the film stoichiometry difficult over time. In contrast, the liquid source delivery method dramatically simplifies the deposition process and also significantly improves the process reproducibility.

In the liquid source delivery method, the metalorganic precursors are dissolved in an organic solvent or solvent mixture to form a precursor solution, and injected into a vaporizer which is located upstream from the reactor inlet. The solvents for preparing the precursor solution could be one or a mixture of the following: aromatic hydrocarbon, cyclic hydrocarbon and chain hydrocarbon.

The precursors could be one of the following: alkyls of elements comprising Ba, Sr, Ru, or Ti; alkoxides of elements comprising Ba, Sr, Ru or Ti; β-diketonates of elements comprising Ba, Sr, Ru, or Ti; metallocenes of elements comprising Ba, Sr, Ru, or Ti; or a combination of at least two alkyls, alkoxides, β-diketonates, and metallocenes of elements comprising Ba, Sr, Ru, or Ti. The precursors could be dissolved in solvents like tetrahydrofuran ($C_4H_8O$), because of its solvating power and its compatibility with the precursors at a molarity of 0.05 to 0.5M. The precursor vapor will then be carried upstream by $N_2$ carrier gas to the reactor inlet where deposition of the films takes place.

BRIEF DESCRIPTION OF THE DRAWINGS

FIG. 1 is a schematic depiction of a dynamic random access memory device in accordance with the present invention.

FIG. 2 is a schematic diagram of a hot walled apparatus for use in applying the $(Ba_{1-x}Sr_x)TiO_3$ and $(Ba_{1-x}Sr_x)RuO_3$ thin films in accordance with the hot-wall MOCVD process of the present invention.

DETAILED DESCRIPTION OF THE INVENTION

Figure 3:
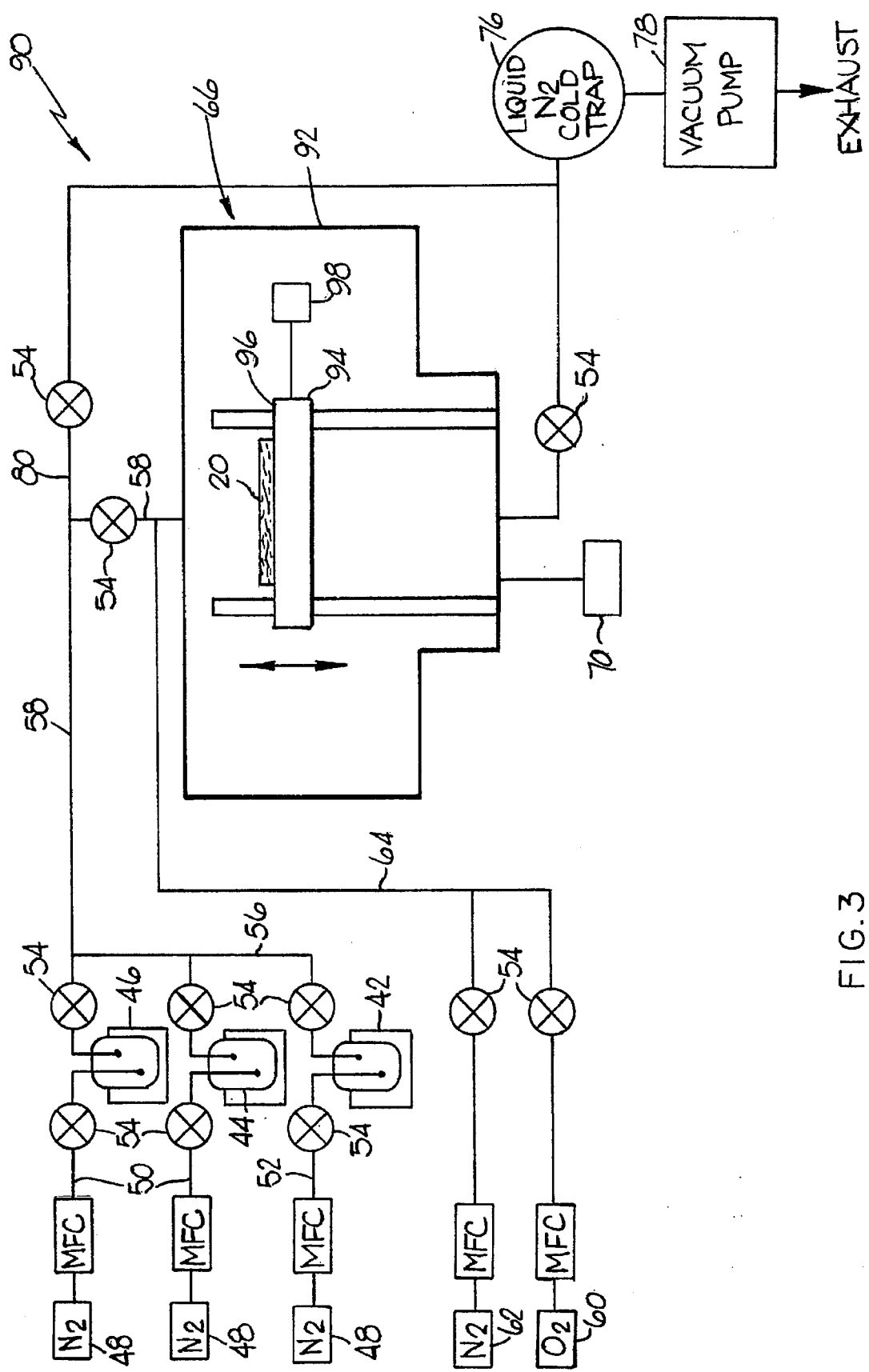
FIG. 3 is a schematic diagram of a cold walled apparatus for use in applying the $(Ba_{1-x}Sr_x)TiO_3$ and $(Ba_{1-x}Sr_x)RuO_3$ thin films in accordance with the cold-wall MOCVD process of the present invention.

A schematic depiction of a memory device 10 in accordance with the present invention is shown in FIG. 1. The device includes a substrate 20 of a suitable material such as silicon, sapphire or gallium arsenide. The substrate 20 may be a multilayer structure having layers of silicon oxide, polysilicon or implanted silicon layers to form a complex integrated circuit. A conductive oxide layer 22, acting as a bottom electrode, is bonded to an upper surface 24 of the substrate 20. A ferroelectric conductive perovskite thin film 26 is bonded to the conductive layer 22 and another conductive oxide layer 28, acting as a top electrode, is bonded to the thin film 26. The top and bottom conductive oxide layers 28, 22 are thin films of $(Ba_{1-x}Sr_x)RuO_3$ and the ferroelectric perovskite layer 26 is a thin film of $(Ba_{1-x}Sr_x)TiO_3$.

Deposition of the conductive oxide layers and the ferroelectric layer is a three step process. The first step is deposition of the thin layer 22 of $(Ba_{1-x}Sr_x)RuO_3$ onto a substrate 20 of a suitable material such as silicon, sapphire or gallium arsenide, thereby forming the bottom electrode. Thin film 22 is applied to the substrate 20 by either metalorganic chemical vapor deposition ("MOCVD") or liquid source delivery method as described in greater detail below.

The second step of the three step process is deposition of thin film 26 of the perovskite ferroelectric $(Ba_{1-x}Sr_x)TiO_3$ by either MOCVD or liquid source delivery method as will be described.

The third step of the three step process is deposition of a second thin layer 28 of $(Ba_{1-x}Sr_x)RuO_3$ onto the $(Ba_{1-x}Sr_x)TiO_3$ layer 26 by either MOCVD or liquid source delivery method.

If the MOCVD process is used, there are basically process that can be used. The two MOCVD processes, hot wall MOCVD and cold wall MOCVD have been found to successfully deposit layers of the $(Ba_{1-x}Sr_x)RuO_3$ and $(Ba_{1-x}Sr_x)TiO_3$. FIG. 2 is a schematic diagram of a hot wall MOCVD apparatus 40. The hot wall MOCVD apparatus consists of first, second and third stainless steel bubblers 42, 44 and 46. $N_2$ cylinders 48 are connected by inlet conduits 50 to the first, second and third stainless steel bubblers, 42, 44 and 46. A mass float controller 52 is in fluid communication with each inlet conduit 50 as is a fluid control valve 54. Outlet conduits 56 connect each stainless steel bubbler 42, 44 and 46 to a furnace delivery conduit 58. Fluid control valves 54 are provided in the outlet conduits 56 for controlling the outflow of the first, second and third stainless steel bubblers. Also connecting to the furnace delivery conduit 58 downstream from the first, second and third stainless steel bubblers 42, 44 and 46 are an $O_2$ cylinder 60 and an $N_2$ cylinder 62. Mass flow controllers 52 and values 54 are in fluid communication between the $O_2$ cylinder 60, the $N_2$ cylinder 62 and a conduit 64. A fluid control valve 54 on the furnace delivery conduit 58 controls the flow of fluids from the first, second and third stainless steel bubblers 42, 44 and 46 into the reaction chamber 66.

A door 68 provides access for loading substrates 20 in the reaction chamber 66. A vacuum gauge 70 in fluid communication with the reaction chamber 68 is provided for monitoring the vacuum pressure in the reaction chamber 66. A three zone furnace 72 is provided for controlling the deposition temperature in the reaction chamber 66. Alternatively, a substrate heater could be employed. A furnace outlet conduit 74 is provided for exhausting waste vapors from the reaction chamber 66. A liquid $N_2$ cold trap 76 is provided on the furnace outlet conduit 74 for capturing waste $N_2$ gas. A vacuum pump 78 provides the appropriate chamber pressure within the reaction chamber 66 and promotes exhausting of waste gases from the reaction chamber 66. A fluid control valve 54 is provided in the conduit 76 for controlling exhaust flow.

A bypass line 80 connects the furnace delivery conduit 58 downstream of the first, second and third stainless steel bubblers 42, 44 and 46 and upstream of the conduit 64 to the furnace outlet conduit 74 downstream of the furnace outlet conduit fluid control valve 54. A fluid control valve 54 is provided on the bypass line 80 for controlling the flow of fluid therethrough.

The warm temperature zone within the hot walled MOCVD apparatus 40 is indicated by dotted lines 82. Use of the hot walled MOCVD apparatus 40 for depositing thin films of $(Ba_{1-x}Sr_x)RuO_3$ requires introduction of the precursor materials $Ru(C_5H_5)_2$, $Sr(C_{11}H_{19}O_2)_2$ and $Ba(C_{11}H_{19}O_2)_2$ into the first, second and third stainless steel bubblers 42, 44 and 46. Carrier gas $N_2$ is provided from the $N_2$ cylinders 48 through the inlet conduits 50 into the bubble chambers 42, 44 and 46. Following reaction in the bubble chambers 42, 44 and 46 effluent from the bubble chambers flows through into the furnace delivery conduit 58. The $O_2$ and $N_2$ cylinders 60, 62 provide a source of dilution and carrier gas to the furnace delivery conduit 58. The valves 54 located throughout the system provide for desired fluid flow control. Inside the reaction chamber 66, the precursors suspended in the $N_2$ carrier gas and combined with the $O_2$ dilution gas deposit a thin layer of $(Ba_{1-x}Sr_x)RuO_3$ upon the substrates 20.

The hot walled MOCVD apparatus 40 can be used for MOCVD deposition of the ferroelectric perovskite thin film of $(Ba_{1-x}Sr_x)TiO_3$ by substituting $Ru(C_5H_5)_2$ as the precursor in the first stainless steel bubbler 42. The MOCVD processing conditions for depositing $(Ba_{1-x}Sr_x)RuO_3$ and $(Ba_{1-x}Sr_x)TiO_3$ films are set forth in Table 1 and Table 2, respectively, below:

TABLE 1

| Precursors | $Ba(thd)_2$ | $Sr(thd)_2$ | $Ru(C_5H_5)_2$ |
| --- | --- | --- | --- |
| Bubbler Temp. | 230–250° C. | 180–200° C. | 140–170° C. |
| Carrier Gas | $N_2$, 20–40 sccm | $N_2$, 20–40 sccm | $N_2$, 5 sccm |
| Dilute Gas | $O_2$, 500–1000 sccm | | |
| Deposition Temp. | 550° C. | | |
| Chamber Pressure | 2–10 torr | | |

(where thd=$C_{11}H_{19}O_2$ and sccm=standard cubic centimeter per minute)

TABLE 2

| Precursors | $Ba(thd)_2$ | $Sr(thd)_2$ | $Ti(OC_2H_5)_4$ |
| --- | --- | --- | --- |
| Bubbler Temp. | 230–250° C. | 180–200° C. | 80–100° C. |
| Carrier Gas | $N_2$, 20–40 sccm | $N_2$, 20–40 sccm | $N_2$, 1–5 sccm |
| Dilute Gas | $O_2$, 500–1000 sccm | | |
| Deposition Temp. | 500° C. | | |
| Chamber Pressure | 2–10 torr | | |

(where thd=$C_{11}H_{19}O_2$ and sccm=standard cubic centimeter per minute)

FIG. 3 is a schematic diagram of a cold walled MOCVD apparatus 90. Like elements of the cold walled MOCVD apparatus 90 and the hot walled MOCVD apparatus 40 are indicated with identical reference numerals and will not be separately described. As appreciated by those skilled in the art, the cold-wall MOCVD apparatus 90 differs from the hot-wall MOCVD apparatus 40 in that (1) only the substrates 20 are heated, (2) the source vapors are vertically injected onto the substrate from the furnace delivery conduit 58 and (3) the wall 92 of the reaction chamber 66 (or the deposition temperature) is kept around 250° C. Otherwise, the conditions set forth in tables 1 and 2 are identical.

A substrate heater 94 is separated from the substrate 20 by a substrate holder 96. The substrate heater 94 can be operated at a maximum temperature of 900° C. with the temperature of the substrate heater being position insensitive within an 8° C. range and the variation in temperature with time being within 1° C.

The substrate holder 96, which is made of INCONEL, directly supports the substrates 20 and is in direct contact with the substrate heater 94. A thermocouple 98 mounted directly inside the center of the substrate holder 96 monitors the temperature of each substrate. The substrates are adhered to the substrate holder 96 by silver paste. The silver paste improves heat conduction and temperature uniformity of the specimens.

The distance between the inlet of the furnace delivery conduit 58 and the substrates can be varied from 1.5 to 10 cm. As is readily apparent, the set up and the control of the bypass line and the bubbler heaters is similar to those of the hot-wall apparatus 40. $Ti(OC_2H_5)_4$ or $Ru(C_5H_5)_2$ are used within the first bubble chamber 42 depending upon whether a layer of $(Ba_{1-x}Sr_x)TiO_3$ or $(Ba_{1-x}Sr_x)RuO_3$ is being deposited. In the first and third steps, the deposition of the top and bottom $(Ba_{1-x}Sr_x)RuO_3$ electrodes is controlled to yield very thin layers 22, 28 of $(Ba_{1-x}Sr_x)RuO_3$.

In the second step, the ferroelectric $(Ba_{1-x}Sr_x)TiO_3$ film 26 is deposited. The $(Ba_{1-x}Sr_x)TiO_3$ ferroelectric layer 26 deposited under the conditions set forth above has been found to have a low Curie temperature at which the transition from the ferroelectric to the paraelectric state occurs. In addition to this relatively low Curie temperature, the $(Ba_{1-x}Sr_x)TiO_3$ layer exhibits other favorable characteristics for DRAM cell applications, including a desireable saturation polarization and a very high dielectric constant. These properties are consistent with fatigue-free, high retentivity, ferroelectric memories.

Figure 4:
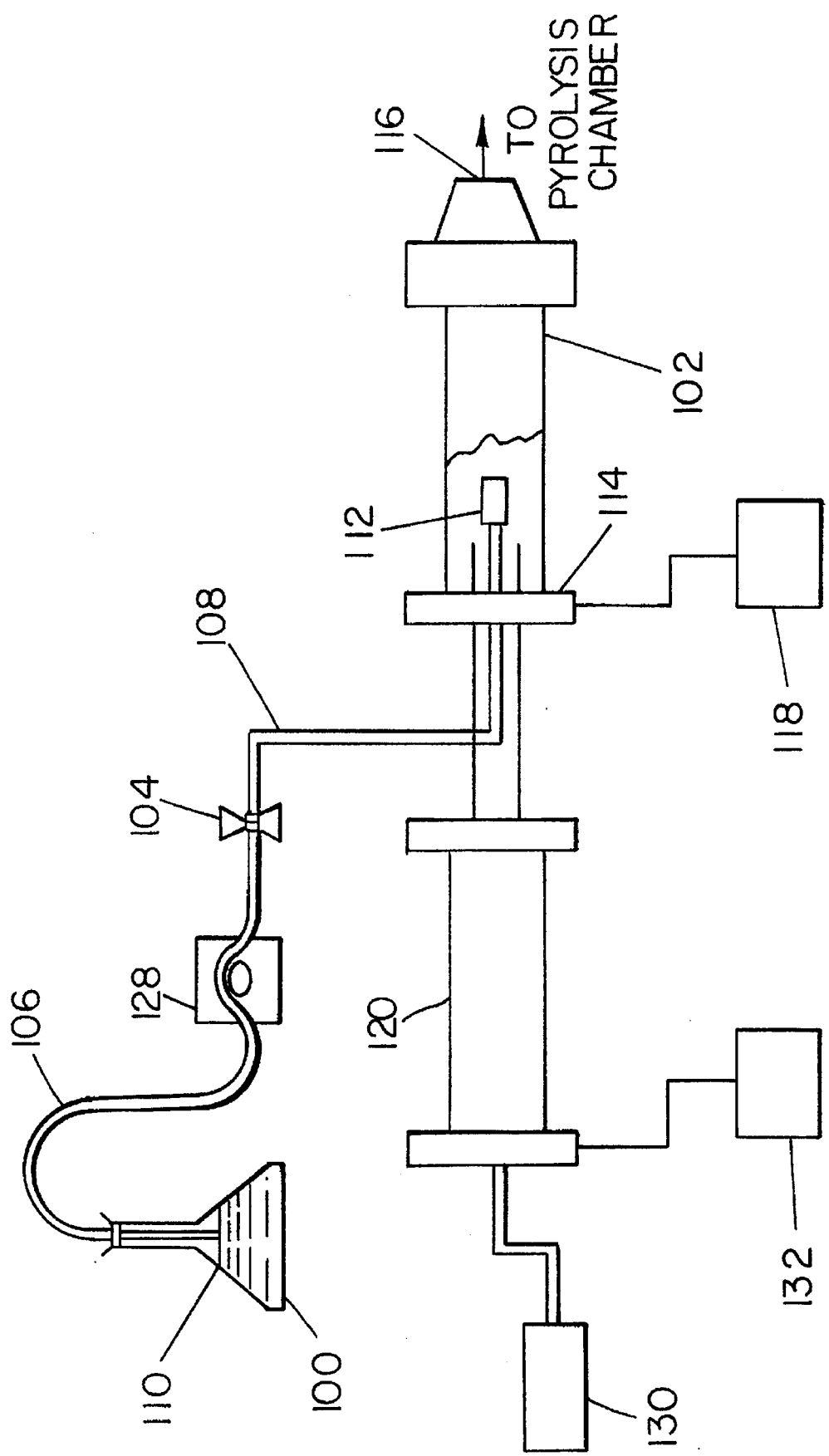
FIG. 4 is a schematic diagram of a liquid source delivery system for use in applying the $(Ba_{1-x}Sr_x)TiO_3$ and $(Ba_{1-x}Sr_x)RuO_3$ thin films in accordance with the liquid source delivery method of the present invention.

Alternatively, as previously mentioned, the liquid source delivery method may be used to create the capacitors of the present invention. FIG. 4 is a schematic diagram of a liquid source delivery system. The source materials of the desired thin film compound are mixed stoichiometrically and held in the liquid form in an Erlenmeyer flask 110. The source is transferred to the flash vaporization chamber 102 by a Masterflex Economy drive 128 (basically a pump with a liquid flow meter) through a series of tubes as shown in FIG. 3. A needle valve 104 is inserted in the flow line to control the flow of the liquid and is connected to the source end by silicone tubing 106 and the vaporization chamber end by stainless steel tubing 108. The source is transferred from the flask 110 to the silicone tubing 106 through a glass rod. The vaporization chamber 102 is sealed on the source end by a flange 114. The stainless steel tube 108 that provides the path for the liquid source delivery is inserted into the vaporization chamber 102 through a tight fit hole drilled into the flange 114. The other end of the chamber 102 is connected to the pyrolysis chamber of the MOCVD reactor, the temperature of which is controlled by a preheat chamber temperature controller 132. The transport rate of the solution to the vaporization chamber 102 is varied from .1 to 10 sccm, depending on the size of the MOCVD reactor. The vaporization chamber 102 is heated as a whole and the temperature is controlled using a temperature controller 118. A preheated carrier gas ($N_2$) is used to transport the vaporized source from the vaporization chamber 102 to the pyrolysis chamber. The flow rate of the carrier gas is controlled using a mass flow controller 130. The carrier gas is sent through a preheat chamber 120 to heat the gases.

Using this method, the metalorganic precursors, either solids or liquids, are placed in flask 110 where they are dissolved in an organic solvent to form a precursor solution.

The organic solvent for preparing the precursor solution could be one or a mixture of the following: aromatic hydrocarbon, cyclic hydrocarbon, and chain hydrocarbon. For example, the solvents could be one or a mixture of the following: tetrahydrofuran ($C_4H_8O$), isaopropanol ($C_3H_7OH$), tetraglyme ($C_{10}H_{22}O_5$), xylene [$C_6H_4(CH_3)_2$], toluene ($C_6H_5CH_3$), and butyl acetate [$CH_3CO_2(CH_2)_3CH_3$]. The precursors are dissolved in solvents like tetrahydrofuran (THF), because of their solvating power and their compatibility with the below mention precursors, at a molarity of 0.05 to 0.5M. The film composition will be controlled by varying the molar ratio of each precursor in the solution. To lower the evaporation of the solution and to increase the stability of the precursors, additives like tetraglyme and isopropanol are utilized.

The precursors could be one of the following: alkyls of elements comprising Ba, Sr, Ru, or Ti; alkoxides of elements comprising Ba, Sr, Ru or Ti; β-diketonates of elements comprising Ba, Sr, Ru, or Ti; metallocenes of elements comprising Ba, Sr, Ru, or Ti; or a combination of at least two alkyls, alkoxides, β-diketonates, and metallocenes of elements comprising Ba, Sr, Ru, or Ti.

Table 3 provides some examples:

TABLE 3

| Element | Composition |
|---------|-------------|
| Ba | $Ba(thd)_2$ or $Ba(fod)_2$ |
| Sr | $Sr(thd)_2$ or $Sr(fod)_2$ |
| Ru | $Ru(C_5H_5)_2$ |
| Ti | Ti ethoxide = $Ti(C_2H_5O)_4$; Ti propoxide = $Ti(C_2H_5O)_4$ or $Ti(thd)_3$ | where $thd=C_{11}H_{19}O_2$ and $fod=C_{10}H_{10}F_7O_2$

Either process described above provides a commercially viable memory product by eliminating degradation of the ferroelectric device due to fatigue, low voltage breakdown and aging. These advantages stem primarily from the similar crystal lattice structures of the $(Ba_{1-x}Sr_x)TiO_3$ and the $(Ba_{1-x}Sr_x)RuO_3$ which increases the stability of the ferroelectric-electrode interface. Application of the $(Ba_{1-x}Sr_x)TiO_3$ and the $(Ba_{1-x}Sr_x)RuO_3$ layers using the either process produces thin films with excellent film uniformity, composition control, high density, high deposition rates and excellent step coverage while utilizing fairly simple equipment that is amenable to large scale processes.

What is claimed is:

1. A method of making a high capacitance capacitor for a memory device comprising the steps of:

a) providing a semiconductor substrate;

b) heating the substrate;

c) exposing the semiconductor substrate to precursors including at least $Ru(C_5H_5)_2$ for depositing a layer of $(Ba_{1-x}Sr_x)RuO_3$ on the substrate forming a bottom electrode;

d) following step c), exposing the semiconductor substrate to precursors including at least $Ti(OC_2H_5)_4$ for depositing a layer of $(Ba_{1-x}Sr_x)TiO_3$ on the bottom electrode forming a ferroelectric; and e) following step d), exposing the semiconductor substrate in a vacuum to precursors including at least $Ru(C_5H_5)_2$ for depositing a layer of $(Ba_{1-x}Sr_x)RuO_3$ on the ferroelectric forming a top electrode.

2. The method of claim 1 wherein in steps c), d) and e) the precursors include $Ba(C_{11}H_{19}O_2)_2$ and $Sr(C_{11}H_{19}O_2)_2$.

3. The method of claim 1 wherein in steps c), d) and e) the precursors are mixed with a carrier gas of $N_2$.

4. The method of claim 1 wherein in steps c), d) and e) the precursors are mixed with a diluting gas of $O_2$.

5. The method of claim 1 wherein in steps c) and e) the substrate is heated to about 550° C.

6. The method of claim 1 wherein in step d) the substrate is heated to about 500° C.

7. The method of claim 1 wherein in steps c), d) and e) the semiconductor is exposed to the precursors at a pressure of about 2–10 torr.

8. The method of claim 4 wherein the $O_2$ diluting gas is at a concentration of between 500–1000 sccm, where sccm signifies standard cubic centimeter per minute.

* * * * *